United States Patent [19]

Padmanabhan et al.

[11] Patent Number: 5,721,151
[45] Date of Patent: Feb. 24, 1998

[54] METHOD OF FABRICATING A GATE ARRAY INTEGRATED CIRCUIT INCLUDING INTERCONNECTABLE MACRO-ARRAYS

[75] Inventors: Gobi Padmanabhan, Sunnyvale; Abraham Yee, Cupertino, both of Calif.

[73] Assignee: LSI Logic Corporation, Milpitas, Calif.

[21] Appl. No.: 484,849

[22] Filed: Jun. 7, 1995

[51] Int. Cl.⁶ .................................................. H01L 21/70
[52] U.S. Cl. ............................ 437/51; 437/8; 437/50
[58] Field of Search ............................ 437/8, 50, 51; 257/202, 203

[56] References Cited

U.S. PATENT DOCUMENTS 4,733,288  3/1988  Sato .................................. 257/203

Primary Examiner—John Niebling
Assistant Examiner—Joni Y. Chang
Attorney, Agent, or Firm—Oppenheimer Poms Smith

[57] ABSTRACT

A plurality of macro-arrays are formed on a semiconductor substrate. Each macro-array includes a logic area in which a plurality of interconnectable logic gates are formed, and an Input/Output (I/O) area in which a plurality of I/O devices are formed. I/O terminals are formed outside the I/O area, which enable the logic devices of the macro-arrays to be interconnected with the logic devices of the other macro-arrays via the I/O devices. Alternatively, connections can be made directly to the logic devices. The interconnections are made using a pattern of conductors such that the macro-arrays are linked to form a composite gate array which provides a programmed logical functionality. A number of contiguous macro-arrays which provide the required number of gates are used, with the unused macro-arrays being cut away and discarded. The array is mounted on and electrically interconnected with a printed circuit board or other support member using a flip-chip arrangement which provides access to internal I/O connections.

13 Claims, 6 Drawing Sheets

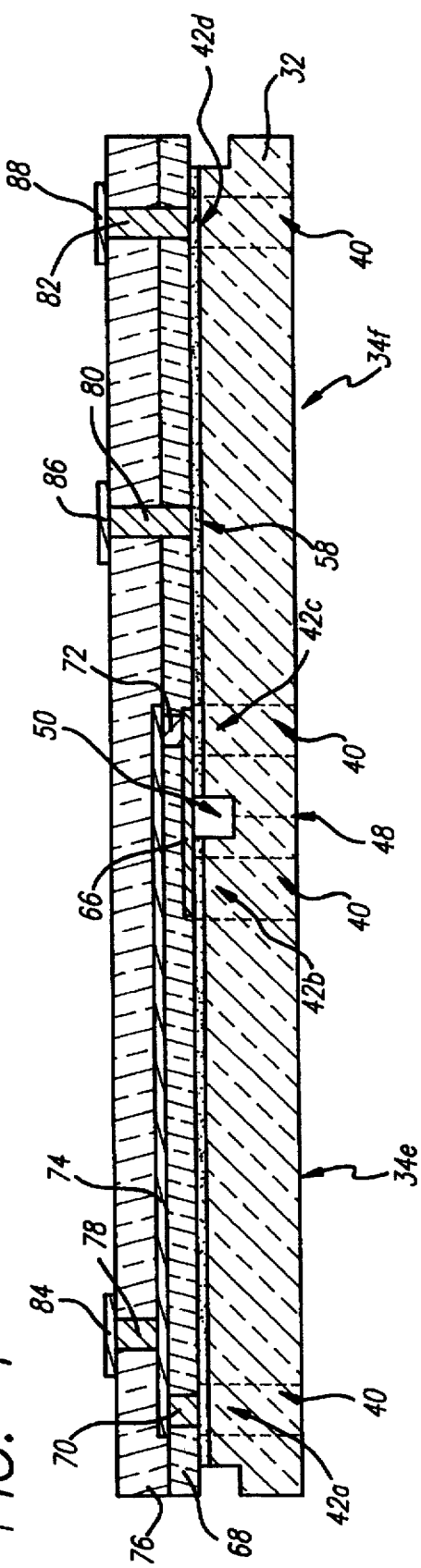

METHOD OF FABRICATING A GATE ARRAY INTEGRATED CIRCUIT INCLUDING INTERCONNECTABLE MACRO-ARRAYS

BACKGROUND OF THE INVENTION

1. Field of the Invention

The present invention generally relates to the art of microelectronic integrated circuits, and more specifically to a gate array integrated circuit and fabrication method including interconnectable macro-arrays.

2. Description of the Related Art

Conventional integrated circuits are generally manufactured using a variety of photolithographic processes, including photoresists, acid etchants, vapor phase and vacuum sputtering deposition processes, and other manufacturing methods which have now become common place for making the multiple small-scale circuit elements and electrical interconnections of current integrated circuits. Many of these integrated circuits use arrays of logic gates. Such integrated circuits are frequently made on substrates of silicon or other semiconductor material, which is processed in the form of a thin wafer having plural small die areas on its surface.

According to the conventional technology, an integrated circuit or die is formed in each of the die areas or an semiconductor processing wafer, and may include many thousands of individual transistors, diodes, and other circuit elements. After the formation of the plural circuits is completed in each of the die areas, the wafer is scribed or cut between the dies to separate these dies into individual circuit die which are subsequently packaged for use. The packaging structure for the individual integrated circuit provides for electrical connection of the small-scale circuit on the die to electrical circuitry outside of the package, as well as providing physical and environmental protection to the packaged circuit die.

Using the conventional architecture, the number of logic gates in the array is limited by the available area within the surrounding perimeters of electrical contact pads and I/O devices. This is known in the art as an "I/O limited design". Consequently, conventional gate array integrated circuit devices are made in graduated sizes, each having progressively larger interior areas for the gate arrays. Conventionally, an integrated circuit may have an array of 80,000 logic gates, for example, while the next larger size of logic gate array circuit has 100,000 gates.

Consequently, when a new information processing problem statement is encountered which requires a logic gate array of 85,000 gates, for example, the smaller circuit is inadequate, and the next larger circuit is oversized and more expensive than is required to do the job. It will be appreciated that the cost of integrated circuits is greatly influenced by the size of the circuit chip, the number of contacts used on the circuit chip, and the size and complexity of the packaging structure used to prepare the integrated circuit chip for its actual use in a circuit.

Consequently, the relationship between these factors and the cost of a finished integrated circuit in its package ready for use in an application, such as installation on a circuit board for a computer or other product, is not a linear relationship. In fact, the die size to cost relationship is generally a geometric relationship, and includes a recognition that with increased die size, the yield of good circuit chips from the manufacturing process goes down according to an exponential of die size.

As a result, the use of an integrated circuit with an array of 100,000 gates to do the job requiring merely 85,000 logic gates pushes the cost to the consumer of the circuit considerably above that which would result were an exactly-sized logic gate circuit available. On the other hand, the number of logic gate circuits sometimes required for various jobs does not justify the cost and delay of designing a custom integrated circuit for the application at hand.

Conventional gate array architectures require a plurality of "masterslices", each of which constitutes a general template or pattern for a particular die size, gate count and circuit complexity. After selection of the appropriate masterslice, a "personalization" step is performed, by which metallization interconnect patterns are designed by computer software to pattern the masterslice in accordance with the overall logical functionality of the circuit. Then, detailed interconnections are specified by the computer software for connecting the individual logic devices or gates of the gate array.

The conventional method is expensive because a number of masterslices, for example 14 masterslices for a 300,000 gate array, must be provided. For I/O limited circuit designs, larger arrays must be used which reduces the gate utilization efficiency and increases fabrication cost. Some designs are not even possible due to excessive I/O requirements.

SUMMARY OF THE INVENTION

The present invention provides a gate array architecture which enables increased flexibility, higher pincount and lower cost. The invention further provides a substantial increase in gate utilization efficiency, and enables gate arrays to be fabricated which could not be possible using conventional I/O limited design architectures.

A method of fabricating a gate array integrated circuit in accordance with the present invention comprises forming a plurality of macro-arrays on a semiconductor substrate. Each macro-array includes a logic area in which a plurality of interconnectable logic gates are formed, and an Input/Output (I/O) area in which a plurality of I/O devices are formed.

I/O terminals are formed outside the I/O area, which enable the logic devices of the macro-arrays to be interconnected with the logic devices of the other macro-arrays via the I/O devices.

Alternatively, connections can be made directly to the logic devices. The interconnections are made using a pattern of conductors such that the macro-arrays are linked to form a composite gate array which provides a programmed logical functionality.

A number of contiguous macro-arrays which provide the required number of gates are used, with the unused macro-arrays being cut away and discarded.

The invention essentially utilizes a macro-array architecture including a sea of gates surrounded by an I/O array which is itself surrounded by scribe lines. The macro-array is the generic cell that is replicated over an entire wafer. Software is designed such that the macro-array can be used itself as the lowest gate count family. For larger families, the software can stitch or link macro-arrays together to form larger composite arrays.

The I/O elements are not confined to the periphery of the gate array. I/O elements that are inside the gate array can be bonded using, for example, bump and flip-chip technology. In larger gate count families, internal I/O elements can be used to drive signals from one macro-array to another.

These and other features and advantages of the present invention will be apparent to those skilled in the art from the following detailed description, taken together with the accompanying drawings, in which like reference numerals refer to like parts.

DESCRIPTION OF THE DRAWINGS

FIG. 4 is a sectional view illustrating how electrical connections can be made to the macro-arrays of the gate array;

FIG. 5 is a sectional view illustrating how the gate array can be mounted on and connected to a motherboard in a flip-chip configuration;

DETAILED DESCRIPTION OF THE INVENTION

Figure 1:
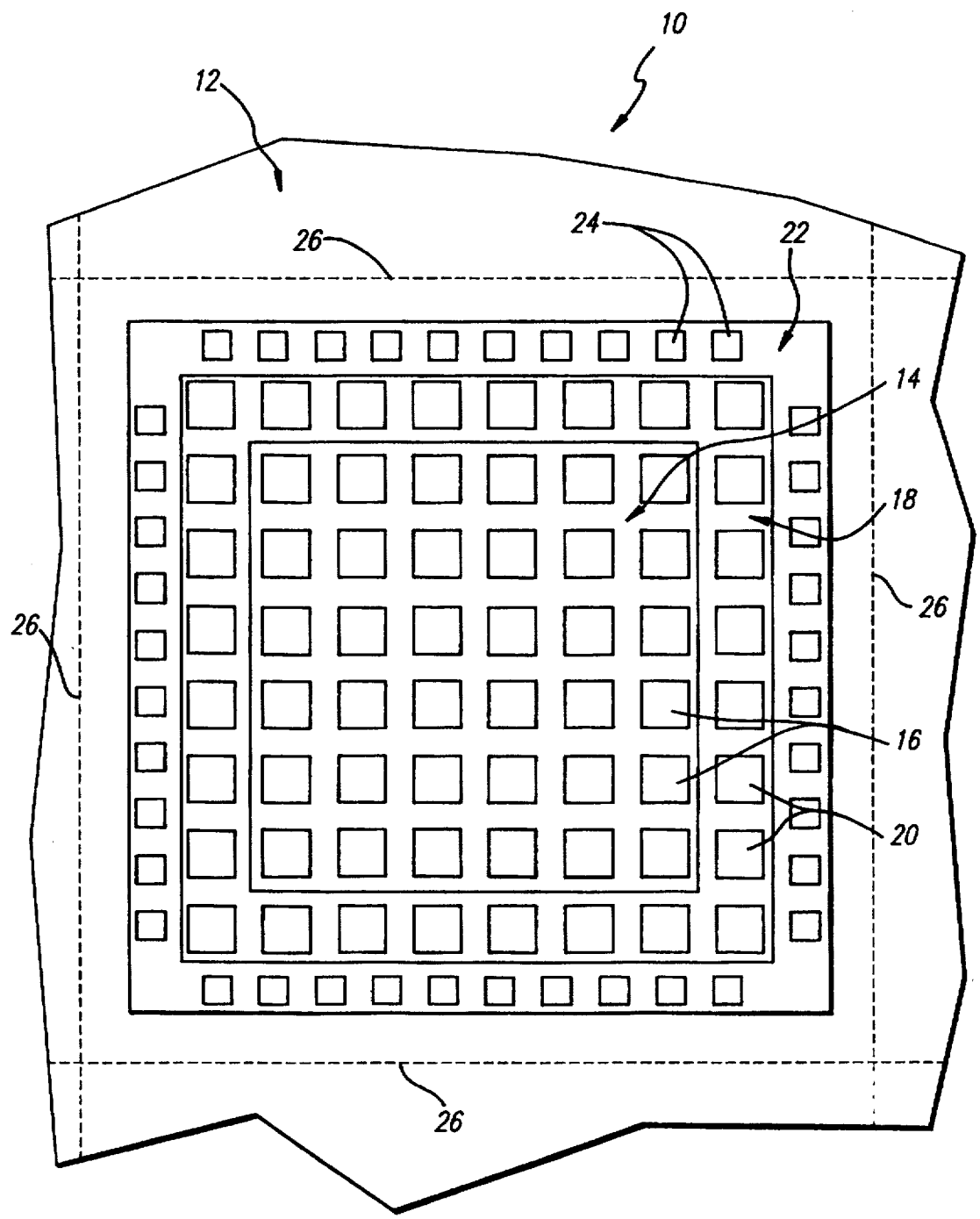
FIG. 1 is a diagram illustrating a prior art gate array.

For comparative purposes, a conventional integrated circuit gate array 10 is illustrated in FIG. 1 as being formed on a semiconductor substrate 12. The array 10 comprises a central logic area 14 in which are formed a large number, for example 100,000, logic gates or devices 16. This arrangement is known in the art as a "sea of gates". It will be understood that only a few of the devices 16 can be illustrated in the drawing with any degree of clarity.

The array 10 further comprises an I/O area 18 in which are formed a plurality of Input/Output (I/O) devices 20. Although not explicitly illustrated, the logic devices 16 are typically NAND gates or other logical elements, whereas the I/O devices 20 are typically drivers or buffers.

A terminal area 22 is formed outside the I/O area 18 and has a plurality of pins or terminals 24 formed therein which enable connection of the array 10 to a support member and/or other electronic circuit elements. Typically, the array 10 will be mounted in a package (not shown), with the terminals 24 being connected to metal leads on the package by wirebonds and/or a leadframe.

The gate array 10 is configured to provide a desired logical functionality by interconnecting the individual logic devices 16, I/O devices 20 and terminals 24 by means of conductor patterns consisting of one or more layers of metal or polysilicon interconnects. The conductor patterns are configured using computer software which is commercially available and is not the particular subject matter of the invention. After the patterns are configured, the interconnects are made using conventional photolithography, patterning, etching, etc.

Although only one gate array 10 is illustrated in FIG. 1, a plurality of identical arrays are conventionally formed on a single semiconductor substrate and later separated for packaging. Typically, scribe lines 26 are formed in the substrate 12 between adjacent gate arrays 10, and the substrate 12 is severed at the scribe lines 26 to separate the portions of the substrate 12 on which the individual arrays 10 are formed into individual integrated circuit dies.

As described above, the conventional gate array as illustrated in FIG. 1 is disadvantageous in a number of aspects, including the necessity to provide a substantial number of masterslices. On I/O limited circuit designs, larger arrays must be used which reduces the gate utilization efficiency and increases fabrication cost, and some designs are not even possible due to excessive I/O requirements.

Figure 2:
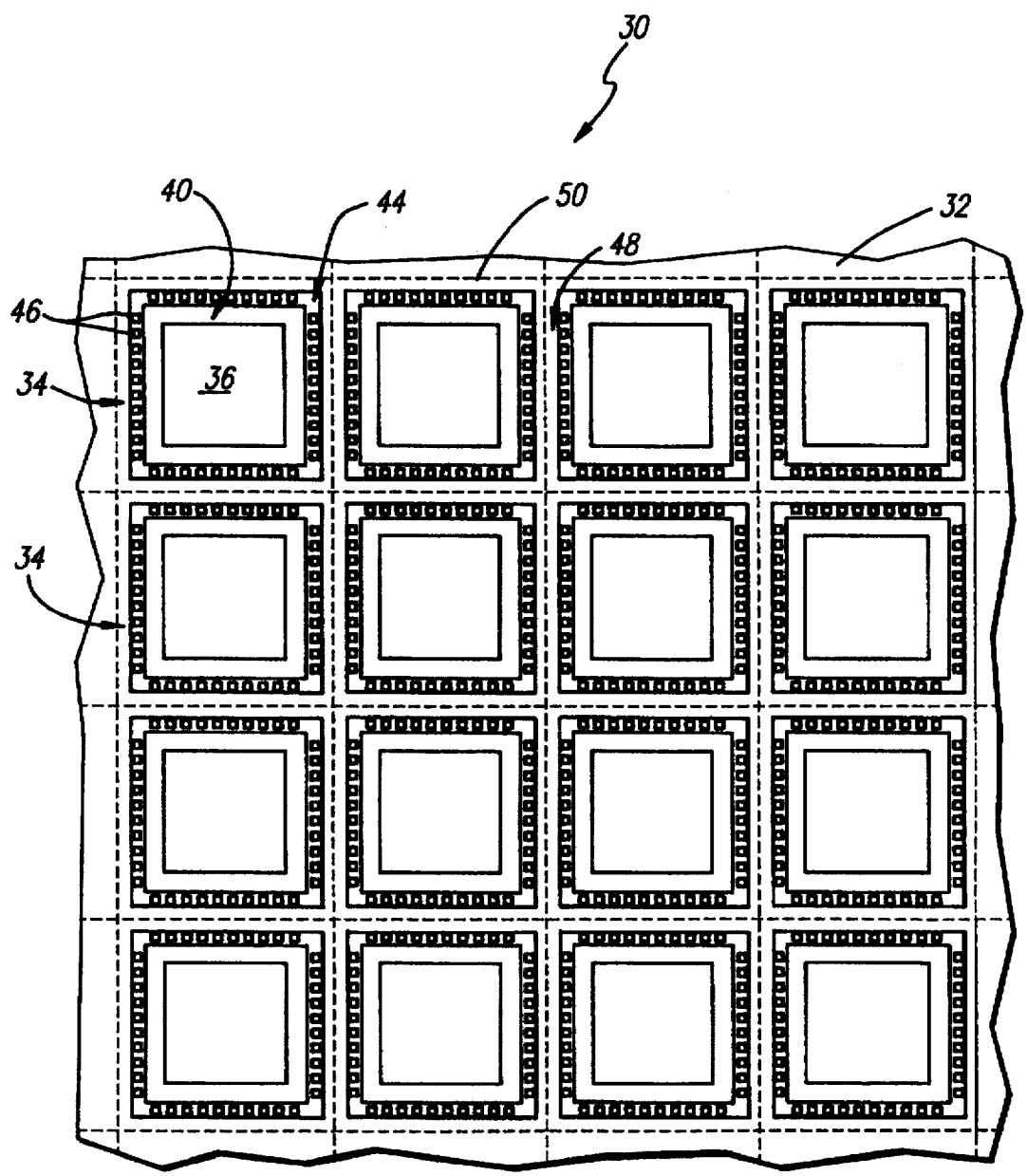
FIG. 2 is a diagram illustrating a gate array according to the present invention.
Figure 3:
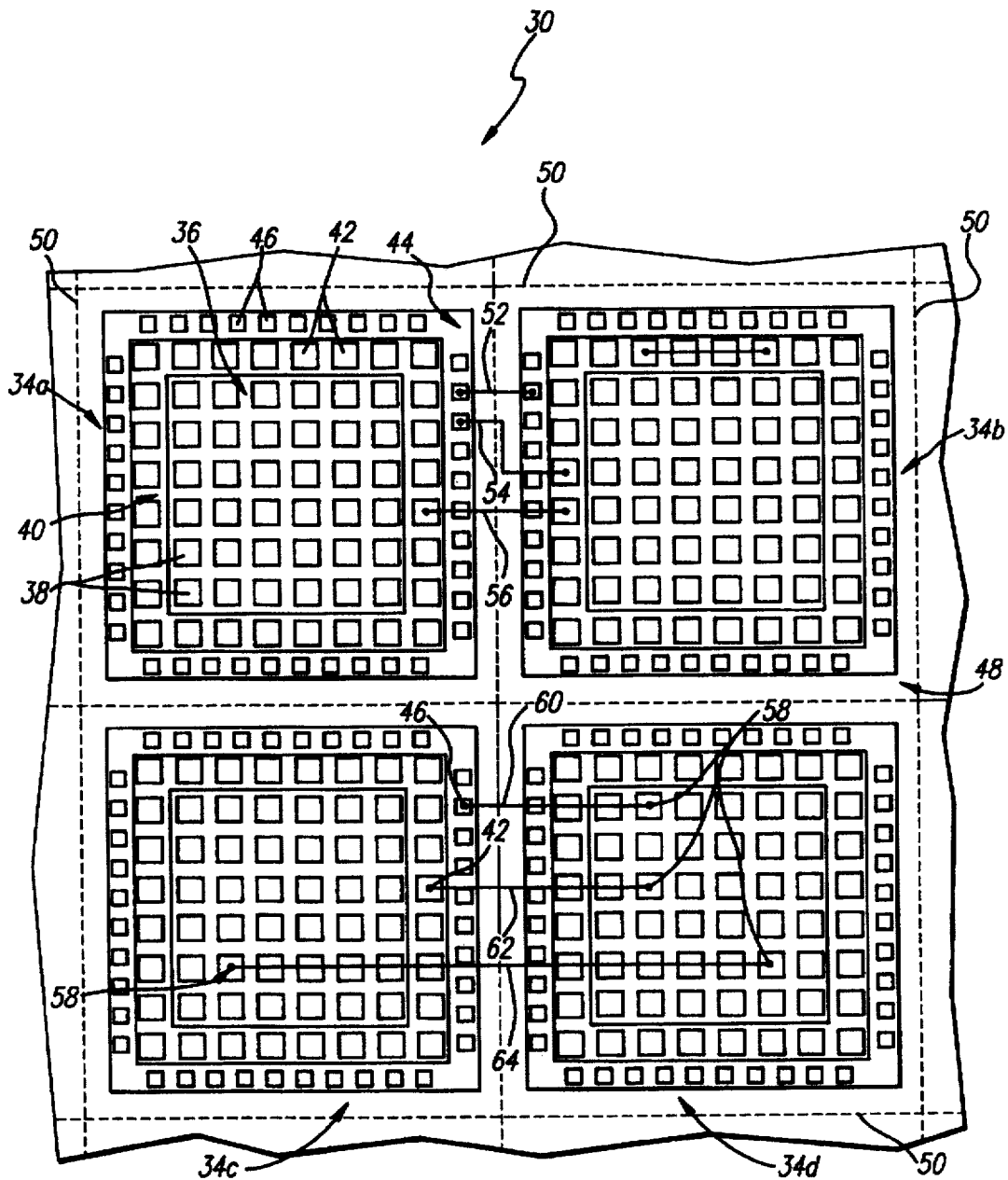
FIG. 3 is a diagram illustrating how macro-arrays of the gate array of FIG. 2 can be interconnected.

These drawbacks are overcome by an integrated circuit gate array 30 which is fabricated in accordance with a method of the present invention as illustrated in FIGS. 2 and 3. The present gate array 30 is formed on a semiconductor substrate 32, and comprises a plurality of macro-arrays 34. The internal components of only one macro-array 34 are labeled to avoid cluttering of the drawing.

As best seen in FIG. 3, each macro-array 34 comprises a central logic area 36 in which are formed a large number of logic gates or devices 38. The array 30 further comprises an I/O area 40 surrounding the periphery of the logic area 36 in which are formed a plurality of Input/Output (I/O) devices 42. Although not explicitly illustrated, the logic devices 38 are typically NAND gates or other logical elements, whereas the I/O devices 42 are typically drivers or buffers.

A terminal area 44 is formed outside the periphery of the I/O area 40, and has a plurality of pins or terminals 46 formed therein which enable connection of the array 30 to other macro-arrays 34 and to external electronic circuit elements.

In the array 30, the macro-arrays 34 are spaced from each other on the substrate 32 to define "scribe streets" 48 therebetween. Scribe lines 50 are formed in the scribe streets 48 which enable the substrate 32 to be severed at the scribe lines 50 to separate the portions of the substrate 32 on which the individual macro-arrays 34 are formed.

Although only sixteen macro-arrays 34 are illustrated in FIG. 2, a preferred embodiment of the gate array 30 comprises 64 macro-arrays 34 formed in a 20×20 millimeter field on the substrate 32. Each macro-array 34 includes approximately 10,000 logic devices 38 and 70 I/O terminals 46. Thus, the array 30 has approximately 640,000 gates or logic devices 38, and 4,000 I/O terminals 46.

The macro-arrays 34 are identical in the most basic architecture. However, it is possible to have several different macro-array designs in the same array, for example 64 different designs, by customizing the interconnect layers (not shown). Also, although the macro-arrays 34 are illustrated as being square in shape, they can be rectangular or have some other shape, and/or can be of different sizes and/or shapes.

A single macro-array 34 is designed to provide the smallest gate count design of the present architecture. More specifically, the gate array 34 can consist of a single macro-array 34 with 10,000 gates.

Larger designs are provided by linking several macro-arrays 34 together using interconnect wiring. For example, the next largest gate array will comprise two contiguous macro-arrays 34. The unused macro-arrays 34 can be left on the substrate 32, or can be detached from the used macro-arrays 34 and discarded by severing the substrate 32 along the appropriate scribe lines 50. The largest gate array design will comprise all of the macro-arrays 34, in this example 64, with intermediate sizes constituted by incremental numbers of macro-arrays 34.

The logic gates 38 of each macro-array 34 are interconnected using conventional computer software processing to produce a desired logical functionality. Further interconnections are made between logic devices 38 of different macro-arrays 34 by means of metal or polysilicon conductors. This links the individual macro-arrays 34 together to form a composite gate array 30 which provides the desired overall logical functionality.

These interconnections are also configured using computer software, with the particular functionality depending the individual application. The manner in which the interconnections are configured using computer software is not the particular subject matter of the present invention, and will not be described in detail.

Examples of the types of conductors which interconnect logic gates 38 in different macro-arrays 34 are illustrated in FIG. 3. The logic devices 38 which are to produce external output signals are connected to appropriate I/O devices 42 using conventional conductors which are not shown. The outputs of the logic devices 42 can be connected directly to logic devices 42 in other macro-arrays 34, or can be connected to terminals 46 which are themselves connected to logic devices 42 or terminals 46 in other macro-arrays 34. The logic devices 42 and terminals 46 can also be used to provide interconnection to external electronic components.

In FIG. 3, a conductor 52 is illustrated as connecting a terminal 46 in a macro-array 34a to a terminal 46 in a macro-array 34b. This connection can be made by forming the conductor 52 directly on the substrate 32 over the scribe street 48 between the macro-arrays 34a and 34b.

Alternatively, this and other connections which will be described below can be made by forming a dielectric layer over the substrate 32 and macro-arrays 34, forming conductive vertical interconnects (vias) through the dielectric layer into electrical connection with the two elements to be interconnected, and forming the conductor over the dielectric layer in electrical connection with the vias. In complex designs, a plurality of dielectric and conductor layers and associated vias can be provided.

A conductor 54 is illustrated as interconnecting a terminal 46 in the macro-array 34a with an I/O device 42 in the macro-array 34b. A conductor 56 interconnects an I/O device 42 in the macro-array 34a with an I/O device 42 in the macro-array 34b.

It is further within the scope of the invention to provide auxiliary I/O devices 58 in the logic areas 36 of the macro-arrays 34. A conductor 60 is illustrated as interconnecting a terminal 46 in a macro-array 34c with an auxiliary I/O device 58 in a macro-array 34d. A conductor 62 interconnects an I/O device 42 in the macro-array 34c with an auxiliary I/O device 58 in the macro-array 34d. A conductor 64 interconnects an auxiliary I/O device 58 in the macro-array 34c with an auxiliary I/O device 58 in the macro-array 34d.

Since the conductors 54, 56, 60, 62 and 64 pass over internal areas of macro-arrays 34, they are preferably formed over a dielectric layer as described above. However, the invention is not so limited, and in some applications these conductors can be formed directly over the macro-arrays 34.

FIG. 4 illustrates exemplary interconnections of the I/O devices 42 and 58. I/O devices 42b and 42c of macro-arrays 34e and 34f respectively are illustrated as being interconnected by a conductor 66 which is formed directly over the substrate 32.

A dielectric layer 68 of, for example, silicon dioxide, is formed over the substrate 32 and macro-arrays 34e and 34f. Vias 70 and 72 are formed through the dielectric layer 68 into electrical interconnection with the I/O devices 42a and 42c respectively. The vias 70 and 72 are electrically interconnected by a conductor 74 which is formed over the dielectric layer 68.

Another dielectric layer 76 is formed over the dielectric layer 68 and conductor 74. Vias 78, 80 and 82 are formed through the dielectric layer 76 into electrical connection with the conductor 74, auxiliary I/O device 58 and I/O device 42d respectively. The vias 80 and 82 also extend through the dielectric layer 68.

In order to enable the gate array 30 to be mounted in a flip-chip arrangement and thereby provide access to internal I/O connections, electrically conductive contact pads 84, 86 and 88 are formed on the dielectric layer 76 in electrical connection with the vias 78, 80 and 82 respectively.

FIG. 5 illustrates how the present gate array 30 can be mounted on and electrically interconnected with a printed circuit board (PCB) 90 or other support member. The PCB 90 has an interconnect metallization pattern formed thereon which includes contact pads 92. The gate array 30 has conjugate contact pads 94 formed thereon as described with reference to FIG. 4. The gate array 30 is inverted (flipped over) and mounted on the PCB 90 with the contact pads 92 and 94 being ohmically interconnected by electrical conductive bumps 96 made of solder, indium, etc.

Figure 6:
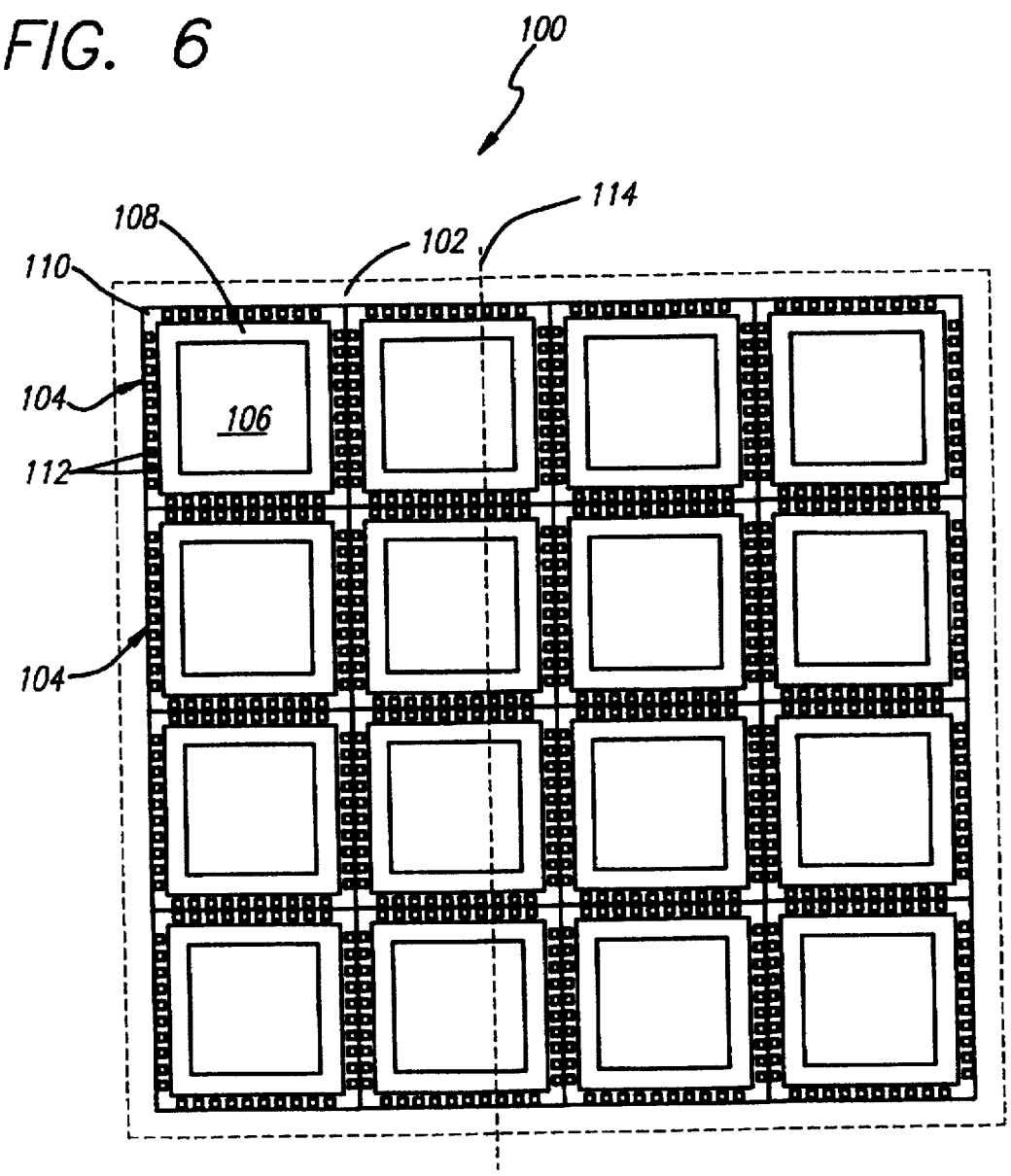
FIG. 6 is a diagram illustrating modified gate array according to the invention.

FIG. 6 illustrates a modification of the gate array 30. A gate array 100 is formed on a substrate 102 and comprises a plurality of macro-arrays 104 in an arrangement with substantially no spaces provided therebetween. Each macro-array 104 comprises a logic area 106, I/O area 108, terminal area 110 and terminals 112 substantially as described with reference to FIGS. 2 and 3.

In the arrangement of FIG. 6, no scribe streets or scribe lines are provided between adjacent macro-arrays 104. Unused macro-arrays 104 can be removed from the array 100 by cutting through the peripheral areas of unused macro-arrays 104. As illustrated, the array 100 can be cut along a line 114 such that the four macro-arrays 104 to the right of the line 114 are used to constituted the final gate array, whereas the four macro-arrays 104 to the left of the line 114 are discarded.

Figure 7:
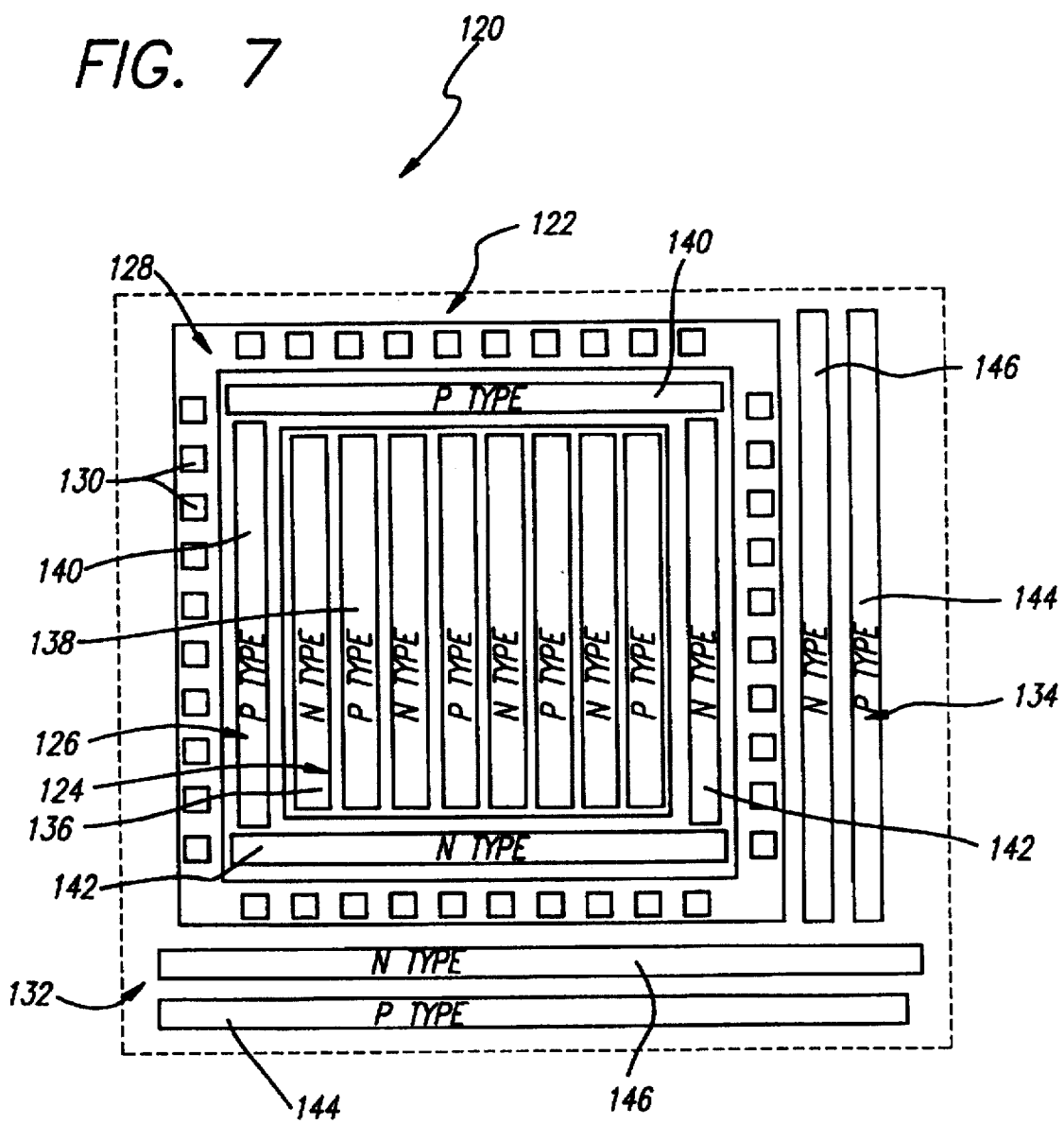
FIG. 7 is a diagram illustrating another modified gate array according to the invention.

FIG. 7 illustrates alternative arrangements and modifications to the basic gate array architecture. A macro-array 120 is formed on a substrate 122 and has a logic area 124, an I/O area 126, a terminal area 128 and terminals 130 as described above. Rather than being centered between scribe streets as illustrated in FIGS. 2 and 3, the terminal area 128 and circumscribed logic area 124 and I/O area 126 are disposed adjacent to the upper right corner of the macro-array 120.

A scribe street 132 is provided in the lower portion of the macro-array 120, whereas a scribe street 134 is provided in the right portion of the macro-array 120.

The various microelectronic devices of the macro-array 120 are preferably provided in rows and columns depending on the conductivity types of the devices. This enables N-wells and P-wells to be advantageously formed in the substrate 102 by ion implantation in straight lines for fabrication of field-effect transistors of the respective conductivity types therein.

In the exemplary arrangement illustrated in FIG. 7, the logic area 124 is divided into columns of alternating N type areas 136 and P type areas 138 for forming NMOS and PMOS devices therein. The devices formed in these areas can include logic devices and auxiliary I/O devices as described above. Similarly, the I/O area 126 is divided into P type areas 140 and N type areas 142.

FIG. 7 also illustrates how auxiliary I/O devices can be formed in the scribe streets 132 and 134. As shown, these devices are formed in P type areas 144 and N type areas 146.

Various modifications will become possible for those skilled in the art after receiving the teachings of the present disclosure without departing from the scope thereof.

For example, it is within the scope of the invention to omit the terminals and make all connections directly to the I/O devices using flip-chip bumps and vias. It is also possible to eliminate the I/O and terminal areas, and distribute the I/O devices within the logic area of each macro-array.

It is also possible to eliminate all physical boundaries between adjacent macro-arrays, and provide the gate array as a seamless sea of gates with I/O devices distributed therein using computer software. Such a gate array can be tailored to a desired size by cutting through unused gates to discard the unused portions of the array.

We claim:

1. A method of fabricating an integrated circuit, comprising the steps of:

providing a semiconductor substrate;

forming a gate array on said substrate to produce a desired overall logical functionality;

said gate array including a plurality of interconnectable macro-arrays each having:

a central logical area having a plurality of interconnectable logic devices formed therein for implementing a desired logical functionality;

an input/output area spaced from said logical area and surrounding the periphery of said logical area having a plurality of input/out devices formed therein to facilitate interconnection of selected ones of the plurality of macro-arrays to implement said desired overall logical functionality; and a terminal area spaced from said input/output area and surrounding the periphery of said input/output area having a plurality of terminal formed therein to further facilitate interconnection of the selected ones of the plurality macro-arrays to implement said desired overall logical functional;

said plurality of macro-arrays being spaced from one another to define an array of scribe street, each individual scribe street having a scribe line to facilitate separating the selected ones of said plurality of macro-arrays from the other individual ones of said plurality of macro-arrays to provide an integrated circuit having said desired overall logical functionality.

2. A method according to claim 1, wherein said step of forming includes:

forming said plurality logic devices of each macro-array in said logic area having a periphery; and forming the said plurality of input/output devices of each macro-array in said input/output area which is disposed outside the periphery of the logic area.

3. A method according to claim 2, further comprising the step of:

forming an auxiliary I/O device in the logic area of one of the macro-arrays.

4. A method according to claim 2, wherein said step of forming said plurality of input/output devices includes: forming said input/output area of each macro-array as having a periphery; and the method further comprises the step of:

forming a plurality of I/O terminals outside the periphery of said input/output area of at least one of the macro-arrays.

5. A method according to claim 1, wherein said step of forming includes: forming the macro-arrays as being spaced from each other on the substrate; and the method further comprising:

forming scribe lines on the substrate between the macro-arrays.

6. A method according to claim 5, further comprising forming auxiliary I/O devices between the macro-arrays.

7. A method according to claim 1, wherein each individual one of said plurality of interconnectable macro-arrays are substantially identical to one another.

8. A method according to claim 1, wherein said plurality of interconnectable macro-arrays includes a first type of macro-array and a second type of macro-array.

9. A method according to claim 1, further comprising:

connecting an I/O device of a first macro-array to an I/O device of a second macro-array.

10. A method according to claim 9, further comprising:

removing unused macro-arrays from the substrate.

11. A method according to claim 10, further comprising:

forming scribe lines between the macro-arrays; and severing the substrate along the scribe lines.

12. A method according to claim 1, wherein said step of forming a gate array includes:

forming said plurality of macro-arrays spaced from one another to define an array of scribe streets, each individual scribe street having a scribe line to facilitate separating selected ones of said plurality of macro array from the other individual ones of said plurality of macro arrays to provide an integrated circuit having said desired overall logical functionality.

13. A method of fabricating an integrated circuit according to claim 1, further comprising:

providing a printed circuit board having an interconnect metallization pattern formed thereon;

forming a plurality of contact pads on said metallization pattern;

forming a set of conjugate contact pads on said substrate;

inverting one of the printed circuit board and the substrate; an forming conductive bumps between the respective contact pads of said printed circuit board and said substrate to ohmically interconnect opposing contacts with one another.

* * * * *